US006903565B2

(12) United States Patent
Hartmann

(10) Patent No.: US 6,903,565 B2
(45) Date of Patent: Jun. 7, 2005

(54) APPARATUS AND METHOD FOR THE PARALLEL AND INDEPENDENT TESTING OF VOLTAGE-SUPPLIED SEMICONDUCTOR DEVICES

(75) Inventor: Udo Hartmann, Neuried (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/352,729

(22) Filed: Jan. 27, 2003

(65) Prior Publication Data

US 2003/0141890 A1 Jul. 31, 2003

(30) Foreign Application Priority Data

Jan. 25, 2002 (DE) ......................................... 102 02 904

(51) Int. Cl.[7] .............................................. G01R 31/26
(52) U.S. Cl. ..................................... 324/765; 324/754
(58) Field of Search .............................. 324/754–765, 324/73.1, 76.11, 115

(56) References Cited

U.S. PATENT DOCUMENTS

| 4,782,290 A | * | 11/1988 | Sakai et al. ................. 324/765 |
| 5,087,874 A | * | 2/1992 | Robinson .................... 324/73.1 |
| 5,600,257 A | | 2/1997 | Leas et al. |
| 5,939,875 A | * | 8/1999 | Felps et al. .................. 324/115 |
| 6,064,213 A | * | 5/2000 | Khandros et al. ........... 324/754 |
| 6,233,184 B1 | | 5/2001 | Barth et al. |
| 6,339,338 B1 | * | 1/2002 | Eldridge et al. ............. 324/765 |
| 2002/0109524 A1 | | 8/2002 | Hartmann |

FOREIGN PATENT DOCUMENTS

| DE | 101 07 180 A1 | 9/2002 | |
| DE | 101 33 261 A1 | 1/2003 | |
| EP | 0 678 915 A2 | * 10/1995 | ....... H01L/21/8247 |

* cited by examiner

*Primary Examiner*—Paresh Patel
(74) *Attorney, Agent, or Firm*—Laurence A. Greenberg; Werner H. Stemer; Ralph E. Locher

(57) ABSTRACT

An apparatus for the parallel and independent testing of a plurality of semiconductor devices disposed on a wafer, in which the semiconductor devices are in each case connected to a common voltage supply unit through a controllable isolating apparatus, a voltage-regulating unit, and a current-limiting unit, and to a method for operating such an apparatus.

22 Claims, 5 Drawing Sheets

PRIOR ART

APPARATUS AND METHOD FOR THE PARALLEL AND INDEPENDENT TESTING OF VOLTAGE-SUPPLIED SEMICONDUCTOR DEVICES

BACKGROUND OF THE INVENTION

Field of the Invention

The present invention relates to an apparatus for the simultaneous and mutually independent testing of a plurality of voltage-supplied semiconductor devices disposed on a wafer, including a programmable test apparatus having a plurality of output and input channels—connected to the semiconductor devices—for a functional test of the semiconductor devices, at least one voltage supply unit for supplying voltage to the semiconductor devices during the functional test, and at least one needle card for the simultaneous contact connection of the plurality of semiconductor devices, the plurality being a true subset of all the semiconductor devices disposed on the wafer. Furthermore, the invention relates to a method for operating such an apparatus.

Test apparatuses for semiconductor devices (also referred to herein as test specimens) have voltage supply units for supplying the test specimens during the test, through programmable controllable outputs, for instance, for controlling an external test circuitry, and also through programmable input and output channels. In such a case, input and output channels may be present at least in part as bidirectional channels (I/O ports below). Through the I/O ports, the semiconductor devices to be tested are driven with test patterns and their reactions are reported back to the test apparatus. The total number of I/O ports of a programmable test apparatus, generally, permits a plurality of test specimens to be tested simultaneously.

If the semiconductor devices are tested at a time still prior to singulation on the common wafer (wafer-level test), then a group of semiconductor devices on the same wafer is jointly contact-connected and tested by a needle card. In such a case, a dedicated set of I/O ports and also a dedicated set of internal voltage supply units of the test apparatus are associated with each test specimen at the test apparatus.

In such a case, it is assumed below, for the purpose of simplification, that the test specimens are operated only from one supply potential, but all the considerations, nevertheless, apply correspondingly to test specimens that are operated from more than one supply potential.

The wafer is contact-connected by the needle card by contact needles disposed on the needle card being mechanically pressed onto contact areas that are provided on the surface of the wafer. In a first test step, the contact connection is checked. In a second test step, the semiconductor device has applied to it a supply potential at the supply terminals and defined signal levels at the inputs. In such a case, signal levels and supply potential may exceed the values specified for the semiconductor device (static wafer level burn-in).

A series of defect mechanisms in the semiconductor device is manifested as a short circuit or low-resistance connection between the supply terminals of the semiconductor device and can be detected by an increased current consumption at the supply terminals. For the selection of defective test specimens, current measuring units are provided in output paths of internal voltage supply units of the test apparatus.

With a rising integration density and a larger wafer diameter of the wafers, the number of test specimens per wafer rises. If the test specimens are semiconductor memory devices, more than 1000 semiconductor devices may be disposed on a wafer. By contrast, the number of voltage supply units in the test apparatus remains limited for practical reasons because the internal voltage supply units are precise, programmable voltage supply units.

In the event of a simple parallel connection of a plurality of test specimens to a common internal voltage supply unit, a defective test specimen with a short circuit between the supply terminals blocks the testing of all the test specimens connected to the common internal voltage supply unit. Because the defective current consumption cannot be unambiguously assigned to one of the test specimens within this group, such a method leads to losses of yield.

German Patent Application 101 33 261.0 describes a test apparatus for testing semiconductor devices disposed on a common wafer, in which a program control of the test apparatus programs a switching matrix during the testing through programmable control channels, a voltage supply unit in each case being distributed between a plurality of test specimens through the switching devices (e.g., relays, FETs) of the switching matrix. In such a case, each test specimen can be individually connected to the voltage supply unit or disconnected from the voltage supply unit.

Such an apparatus is illustrated diagrammatically in FIG. 5. A test apparatus 1 having a plurality of internal voltage supply units 5 and current measuring units 6 in each case in the output paths of the internal voltage supply units 5, and also output channels 2 and bidirectional channels 3 for stimulation of the test specimens and evaluation of the reaction of the test specimens, programs a drive apparatus 9 through control channels 4. Isolating apparatuses 11 in supply paths between a respective internal voltage supply unit 5 and a test specimen 14, i.e., semiconductor devices, are controlled through output lines of the drive device 9. In the example depicted, the isolating apparatuses 11 are situated on a needle card 20, which, through contact needles 21, contact-connects a wafer 10 subdivided into chip units 15.

Such an apparatus can be operated, then, for example, such that, after a contact test, the semiconductor devices 14 connected to a common internal or else external voltage supply unit are, firstly, connected successively in each case individually through the isolating apparatuses 11 to the internal voltage supply unit 5. Test specimens, for which a current consumption that exceeds a permissible maximum current consumption is measured, are disconnected for the subsequent tests through the isolating apparatuses 11.

In the case of such a configuration, the complex internal voltage supply units of the test apparatus can be replaced or supplemented by external voltage supply units. The number of test specimens that can be connected to a common voltage supply unit is, then, no longer limited by a maximum load current of the internal voltage supply units.

What is disadvantageous about the apparatus described in German patent application 101 33 261.0 is the sequential measurement of the current consumption of the semiconductor devices each connected to a common voltage supply unit. On account of transient and relaxation processes, the test time for the current consumption is about 0.5 s. Added to this is the changeover time of the isolating apparatuses of about 0.1 s. In the case of a plurality of 64 semiconductor devices connected to a common voltage supply unit, a value of 38.4 s results as total measurement time for detecting the current consumption of the test specimens.

What is furthermore disadvantageous is the voltage drop between the output of the voltage supply unit and the terminals of the test specimen. In such a case, in particular, a contact resistance between the contact needle and a contact area on the wafer may yield significant and greatly fluctuating contributions (>1 ohm). Added to this is the voltage drop across the leads to the needle card.

If it is, then, the case that, in order to test the test specimen at the lower limit of its specified operating voltage range (low-voltage test), the output voltage of the voltage supply unit is set to the value of the lower limit of the operating voltage range, the test specimen is actually tested at a significantly lower operating voltage. This, consequently, leads to losses of yield because the actual test severity is greater than that required.

On the other hand, if a low-voltage test is performed with an output voltage above the lower limit of the operating voltage range, then the test specimen, in the case of a low-resistance contact connection, is not actually tested at the limit of the operating voltage range. The test severity is, then, restricted.

German Published, Non-Prosecuted Patent Application DE 101 07 180.9, corresponding to U.S. Patent Publication No. 2002/109,524A1 to Hartmann, describes an apparatus for improving the accuracy of a voltage supply of memory chips on a wafer during a functional test, in which the accuracy of the voltage supply of memory chips on a wafer is improved by displacing a measurement location.

In such a case, the apparatus is based on a technique—familiar to the person skilled in the art—of voltage regulation at a load with the aid of a load path Force and a high-resistance measurement path Sense.

Such a construction is illustrated diagrammatically in FIG. 4. An internal voltage supply unit 5 of a test apparatus 1 supplies a test specimen 14 through a load path Force. A current consumption is measured by an internal current measuring unit 6 in the load path Force. The supply potential at the location of the test specimen 14 is reported back through a high-resistance measurement path Sense to the voltage supply unit 5, which, thereupon, readjusts the voltage at its output to the load path.

On account of the load current, a voltage drop is produced across the leads up to the needle card 20 and across the contact resistances between the contact needles 21 and contact areas on the wafer 10. On account of the high-resistance nature of the measurement path Sense, a very much smaller current flows in the measurement path Sense. Therefore, in the measurement path Sense, only small voltage drops in each case are produced across the contact resistances of the contact needles 21 with respect to the contact areas on the wafer 10, and also in the leads.

In the apparatus described, each internal voltage supply unit of the test apparatus is connected to exactly one semiconductor device.

If semiconductor devices are subjected, after singulation, to temporally complex test procedures (e.g., dynamic burn-in), then, it is usually the case that, in order to limit the test complexity, a plurality of the singulated semiconductor devices are in each case connected to a single voltage supply unit. This voltage supply unit can, then, usually supply, in the short-circuit situation, a sufficient current intensity to cancel a short circuit that possibly occurs in a semiconductor device after a short time so that it is possible to continue testing the other semiconductor devices connected to the same voltage supply unit.

Due to the high current flow through the contact needles and the feeds on the wafer, this method is usually not suitable for semiconductor devices disposed on a common wafer.

U.S. Pat. No. 5,600,257 to Leas et al. discloses an apparatus and a method for the common testing or burn-in of all semiconductor devices disposed on a wafer. In such a case, the semiconductor devices disposed on a product wafer are connected through a connection unit in each case to a test chip on a test wafer. A test chip may, in this case, be a voltage regulator with a current limiting function. In the case of this apparatus, all terminals on the wafer are contact-connected in one step.

What is disadvantageous about the apparatus described in Leas et al. is the fact that a dedicated test wafer has to be made available, in a complex manner, for each type of product wafer. In particular, given a high number of semiconductor devices on the wafer with in each case a high number of terminals per semiconductor device, reliable contact connection requires a very high mechanical outlay, for example, tens of thousands of contact needles for dynamic random access memories (DRAMs) on a 300 mm wafer.

SUMMARY OF THE INVENTION

It is accordingly an object of the invention to provide an apparatus and method for the parallel and independent testing of voltage-supplied semiconductor devices that overcome the hereinafore-mentioned disadvantages of the heretofore-known devices and methods of this general type and that provide a mechanically uncomplicated apparatus with which a plurality of semiconductor devices disposed on a wafer can be operated from a common voltage supply unit, in which case the semiconductor devices are tested simultaneously and independently of one another and, at the same time, the supply potential is regulated at the location of the semiconductor devices.

With the foregoing and other objects in view, there is provided, in accordance with the invention, an apparatus for the simultaneous and mutually independent testing of voltage-supplied semiconductor devices disposed on a wafer, including supply paths, a programmable test apparatus having a plurality of output and input channels to be connected to the semiconductor devices for functionally testing the semiconductor devices, at least one voltage supply unit connected to the supply paths for supplying voltage through the supply paths to the semiconductor devices during the functional test, at least one needle card adapted to simultaneously contact connect a plurality of the semiconductor devices, the plurality being a true subset of all of the semiconductor devices disposed on the wafer, the at least one needle card connected to the supply paths, a plurality of controllable voltage-regulating units and current-limiting units respectively disposed in each of the supply paths between the at least one voltage supply unit and a respective one of the semiconductor devices, each of the current-limiting units at least one of determining and influencing a current intensity in a respective one of the supply paths, and each of the controllable voltage-regulating units regulating a selectable supply potential of a respective one of the semiconductor devices over a section of the functional test.

Thus, in the case of an apparatus of the type according to the invention, a plurality of semiconductor devices disposed on a wafer are connected through supply paths to a common voltage supply unit. In each supply path, provision is made of a controllable voltage-regulating unit and, for each semiconductor device, in each case a current-limiting unit assigned exclusively to this one semiconductor device in the supply path.

The supply potential made available by the voltage-regulating unit can be selected depending on the respective section of the test. The current-limiting unit ensures an independent and simultaneous test of a plurality of semiconductor devices at a voltage supply unit by a procedure in which the current-limiting unit limits the supply current flowing through it by a customary technique or ascertains an abnormal current consumption of the semiconductor device and, consequently, effects an isolation of the affected semiconductor device from the common voltage supply unit.

In the case of such an apparatus, the testing of semiconductor devices connected to a common voltage supply unit is no longer influenced in any way by a semiconductor device connected to the same voltage supply unit with a short circuit between the supply terminals.

No further losses of yield are produced as a result of the simultaneous testing of a plurality of semiconductor devices at a common voltage supply unit.

The current-limiting units are, preferably, embodied as current measuring units.

In accordance with another feature of the invention, the current measuring unit has a control output. If the measured current consumption exceeds a maximum permissible current consumption of the semiconductor device, then the current-limiting unit supplies at the control output an output signal that can drive an isolating apparatus disposed in the supply path so that a defective semiconductor device is isolated from the common voltage supply unit with the aid of the isolating apparatus.

In accordance with a further feature of the invention, an isolating apparatus is disposed in each of the supply paths and is connected to a respective one of the current-limiting units, each of the current-limiting units controlling a respective one of the current-limiting units with a respective one of the output signals.

In accordance with an added feature of the invention, the current measuring units are in each case connected to the test apparatus through a current measured value interface. The measured values for the current consumption of the semiconductor devices are communicated to the test apparatus through the current measured value interface. As the test progresses further, the test apparatus can control, through a conventional drive device, the isolating apparatus in the supply path of the affected semiconductor device.

In accordance with an additional feature of the invention, the voltage-regulating units are connected to a common controllable reference voltage source. In such a case, the voltage-regulating units are controlled indirectly through the control of the reference voltage source. One of the internal, high-precision and programmable supply units of the test apparatus may, then, serve as reference voltage source.

The output voltage of the voltage-regulating units is tracked to the output voltage of the reference voltage source in a conventional way.

In accordance with yet another feature of the invention, each controllable voltage-regulating unit is connected to a programmable voltage generator. In such a case, the output voltage of the programmable voltage generator can be set by a register value. The register, for its part, can, then, be set through programmable control channels of the test apparatus.

The isolating apparatuses, the controllable voltage-regulating units, and, also, the current-limiting units may be disposed completely or in part on a needle card that effects the contact connection of the terminals of the semiconductor devices on the wafer (contact connection of the wafer hereinafter). The needle card bears contact needles through which electrical signals are transmitted from and to the semiconductor devices on the wafer, and, also, a mechanical interface for flexible connecting lines between the needle card and the test apparatus. A first disadvantage of the configuration is the fact that a matching needle card has to be provided for each type of wafer. A second disadvantage in the case of a configuration of the voltage-regulating units on the needle card is the fact that it is necessary to resort to the force/sense technique, due to the vague contact resistance, for a precise supply potential routing at the test specimen. This technique, in turn, requires additional outlay, for instance, due to the increased number of contact needles required. Moreover, it is, then, necessary to provide, for each semiconductor device, a voltage-regulating unit that is assigned only to this semiconductor device.

Therefore, in accordance with yet a further feature of the invention, the controllable voltage-regulating units and, also, the current-limiting units are disposed at least in part on the wafer itself. This is particularly advantageous because a measurement path can be dispensed with no loss of precision for the supply potential of the semiconductor device, but an additional contact needle per semiconductor chip for carrying the measurement path is always superfluous. Furthermore, likewise without significantly limiting the accuracy of the voltage supply of the semiconductor devices, one voltage-regulating unit can be used for regulating the supply voltage of a plurality of semiconductor devices.

In the case of an advantageous configuration of the isolating apparatuses on the wafers, it is possible to further reduce the number of contact needles required per semiconductor device to be tested.

Preferably, connecting lines between the voltage supply units, the isolating apparatuses, the reference voltage sources, the voltage-regulating units, the test apparatus, and the reference voltage generators are, then, also routed in each case at least in part in the form of bus systems in a kerf between the semiconductor devices on the wafer. Connection devices common to a plurality of semiconductor devices can, then, be provided in each case for the connecting lines so that the number of contact needles can be reduced further.

In accordance with yet an added feature of the invention, the isolating apparatuses, the voltage-regulating units, and the current-limiting units are disposed in a wiring interface between the test apparatus and the needle card. In such a case, the wiring interface is an apparatus through which the flexible leads to the needle cards are routed to electrical connection devices for the inputs and outputs of the test apparatus. Because the isolating apparatuses, the voltage-regulating units, and the current-limiting units are disposed exclusively in the supply paths that are routed in the same way from the wiring interface to the wafer for all types of test specimens, a single wiring interface of this type makes it possible to test different types of wafer and different semiconductor devices. The voltage regulation of the supply potentials is, then, effected using the force/sense technique, each semiconductor device being assigned a voltage-regulating unit and each voltage-regulating unit being assigned a single semiconductor device.

In accordance with yet an additional feature of the invention, isolating apparatuses disposed on the wiring interface, the needle card having contact needles for contact connecting the wafer and flexible leads connected to the test apparatus through the wiring interface.

In accordance with again another feature of the invention, there is provided a wiring interface disposed between the test apparatus and the at least one needle card, the current-limiting units and the voltage-regulating units disposed on the wiring interface, the needle card having contact needles for contact connecting the wafer and flexible leads connected to the test apparatus through the wiring interface.

In accordance with again a further feature of the invention, each of the voltage-regulating units is to be assigned to exactly one of the semiconductor devices and a supply potential of each of the semiconductor devices is to be individually regulated by a respectively assigned one of the regulating unit during a section of the test.

With the objects of the invention in view, there is also provided an apparatus for the simultaneous and mutually independent testing of devices, including a wafer, voltage-supplied semiconductor devices disposed on the wafer, supply paths, a programmable test apparatus having a plurality of output and input channels connected to the semiconductor devices, the test apparatus functionally testing the semiconductor devices, at least one voltage supply unit connected to the supply paths for supplying voltage through the supply paths to the semiconductor devices during a functional test, at least one needle card simultaneously contact connecting a plurality of the semiconductor devices, the plurality being a true subset of all of the semiconductor devices disposed on the wafer, the at least one needle card connected to the supply paths, a plurality of controllable voltage-regulating units and current-limiting units respectively disposed in each of the supply paths between the at least one voltage supply unit and a respective one of the semiconductor devices, each of the current-limiting units at least one of determining and influencing a current intensity in a respective one of the supply paths, and each of the controllable voltage-regulating units regulating a selectable supply potential of a respective one of the semiconductor devices over a section of the functional test.

Regulating the supply potentials at the location of the semiconductor devices by the force/sense technique avoids losses of yield as a result of the testing of the semiconductor devices with an excessively low supply potential during a low-voltage test.

With the objects of the invention in view, there is also provided a method for the simultaneous and mutually independent testing of a plurality of voltage-supplied semiconductor devices disposed on a wafer, including the steps of connecting a plurality of output and input channels of a programmable test apparatus to the semiconductor devices for functionally testing the semiconductor devices, supplying voltage to the semiconductor devices with at least one voltage supply unit during a functional test, simultaneously contact connecting a plurality of the semiconductor devices to at least one needle card, the plurality being a true subset of all of the semiconductor devices disposed on the wafer, regulating a supply potential of each of the semiconductor devices independently of the at least one voltage supply unit with controllable voltage-regulating units disposed in a supply path between the at least one voltage supply unit and a respective one of the semiconductor devices, and one of limiting a current consumption of an individual semiconductor device through the supply path with a current-limiting unit and interrupting a supply path of an individual semiconductor device if a maximum permissible current consumption is exceeded.

In a method of the type according to the invention for the simultaneous and independent testing of a plurality of voltage-supplied semiconductor devices disposed on a wafer at at least one common voltage supply unit by a programmable test apparatus having inputs and outputs for a functional test of the semiconductor devices, the supply potential of a semiconductor device is now regulated in each case by a controllable voltage-regulating unit independently of the common voltage supply unit, the current in the supply paths of the semiconductor device is limited by a current-limiting unit or, in the case of a defect, the supply paths are interrupted by the isolating apparatus.

In accordance with again an added mode of the invention, there are provided the steps of disposing in a supply path of each of the semiconductor devices a respective isolating apparatus and a current-limiting unit, the current-limiting unit being a current measuring unit detecting current consumption of a respective one of the semiconductor devices in each supply path and effecting an interruption of a supply path with the respective isolating apparatus if a current consumption is detected to be higher than a maximum permissible current consumption.

Preferably, the current-limiting unit embodied as a current measuring unit detects the current consumption of the semiconductor device in the supply path and, in the event of a measured current consumption that is higher than a maximum permissible current consumption, effects an interruption of the supply path by an isolating apparatus disposed in the supply path.

In accordance with again an additional mode of the invention, the measured values determined by the current-measuring units are transmitted to the test apparatus through a current measured value interface. The test apparatus compares the measured value with a maximum permissible value for the current consumption of the semiconductor device and effects an interruption of the supply path through a conventional drive device.

An impairment of the testing of semiconductor devices connected to the same voltage supply unit is prevented in both cases.

In accordance with still another mode of the invention, there are provided the steps of programming at least one drive device with control channels of the test apparatus, controlling the isolating apparatuses with the at least one drive device, evaluating the measured values transmitted by the current measuring units in the test apparatus, and effecting an interruption of a supply path with the respective isolating apparatus if a current consumption is detected to be higher than a maximum permissible current consumption.

In accordance with still a further mode of the invention, there are provided the steps of respectively connecting at least a plurality of the voltage-regulating units to a common reference voltage source and controlling the plurality of the voltage-regulating units with the reference voltage source dependent upon a given section of the functional test.

In a particularly simple manner, the controllable voltage-regulating units are driven through a common reference voltage source. In such a case, the output voltages of the voltage-regulating units follow the reference voltage of the reference voltage source using a customary technique. What is disadvantageous about such a method is a possible voltage drop in reference voltage feeds and, thus, imprecise supply potentials at the semiconductor devices. This applies, in particular, to a realization of the voltage-regulating units on the wafer because the reference voltage is, then, passed through a contact needle and a contact area on the wafer. Moreover, an introduced interference voltage may be superposed on the reference voltage at any time.

In accordance with a concomitant mode of the invention, there are provided the steps of connecting each of the voltage-regulating units to a programmable reference voltage generator and programming the reference voltage generators with the test apparatus dependent upon a given section of the functional test.

Therefore, in a particularly preferred manner, each of the controllable voltage-regulating units is connected to a programmable reference voltage generator whose output value is controlled by a register. In such a case, the register is set by the test apparatus by programmable control channels.

Because the value for the output voltage of the controllable voltage-regulating units is transmitted digitally to the voltage-regulating unit, this method is less prone to errors. Both the method according to the invention and the apparatus according to the invention can be extended by a person skilled in the art to semiconductor devices that require more than one supply potential during operation.

Other features that are considered as characteristic for the invention are set forth in the appended claims.

Although the invention is illustrated and described herein as embodied in an apparatus and method for the parallel and independent testing of voltage-supplied semiconductor devices, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
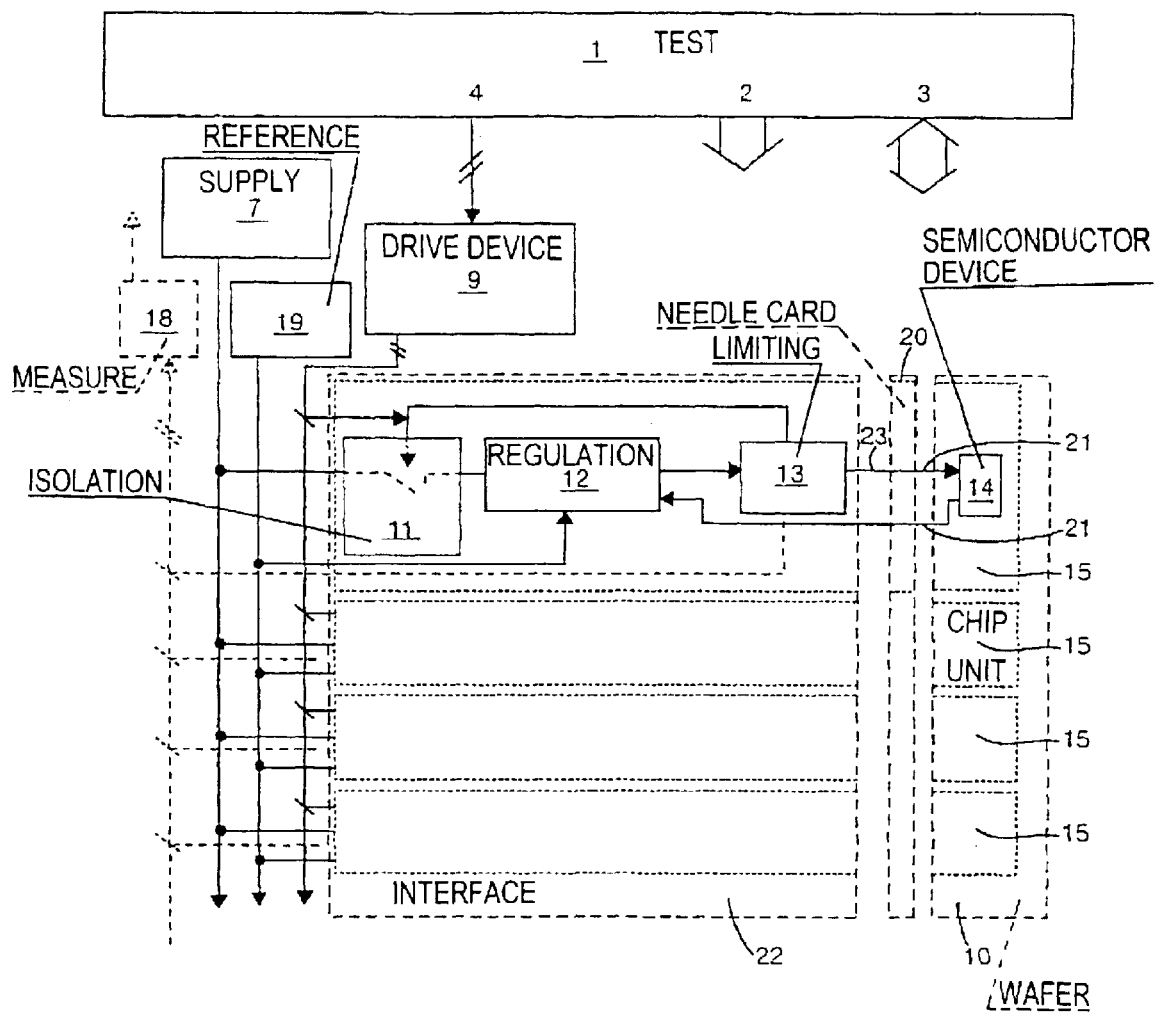
FIG. 1 is a block circuit diagram of an apparatus according to a first exemplary embodiment of the invention.

Referring now to the figures of the drawings in detail and first, particularly to FIG. 1 thereof, there is shown a test apparatus 1 for testing a plurality of semiconductor devices 14 disposed on a wafer 10. In such a case, the illustration remains limited to the parts that are relevant for the invention for testing an individual semiconductor device.

The test apparatus 1 has a plurality of output channels 2 and bidirectional channels 3. Through the channels 2, 3, the semiconductor devices 14 are stimulated with test signals and their reactions are detected and evaluated.

During the test, a plurality of semiconductor devices 14 on a wafer 10 are in each case supplied through a common voltage supply unit 7. In this illustration, the common voltage supply unit 7 is shown as an external voltage supply unit. An isolating apparatus 11, a voltage-regulating unit 12, and also a current-limiting unit 13 are in each case disposed successively in the supply path between a semiconductor device 14 and the voltage supply unit 7. Isolating apparatuses 11, voltage-regulating units 12, and current-limiting units 13, the illustration of which is dispensed with for the sake of better clarity, are also provided in the same way in the supply paths of other non-illustrated semiconductor devices disposed on the wafer 10.

An output voltage of the voltage-regulating units 12 is controlled through an output of the reference voltage source 19. The reference voltage at the output of the reference voltage source 19, in turn, is prescribed in a manner dependent on a section of the test (low-voltage test, maximum-voltage test), for instance, by the test apparatus 1. The test apparatus 1 can control the isolating apparatus 11 through a drive device 9 in a known way.

A current-limiting unit 13 measures the current consumption of the semiconductor device 14, compares the current consumption with a permissible maximum value, and isolates the semiconductor device 14 from the common voltage supply unit 7 with the aid of the isolating apparatus 11 when the permissible maximum value is exceeded.

Furthermore, the measured value of the current consumption is transmitted to the test apparatus 1 through a current measured value interface 18. The isolating apparatus 11, the voltage-regulating unit 12, and the current-limiting unit 13 are disposed in a wiring interface 22. Flexible leads 23 lead from the wiring interface 22 to a needle card 20. Through contact needles 21, electrical signals are passed from the needle card 20 to connection devices on the wafer 10.

Figure 2:
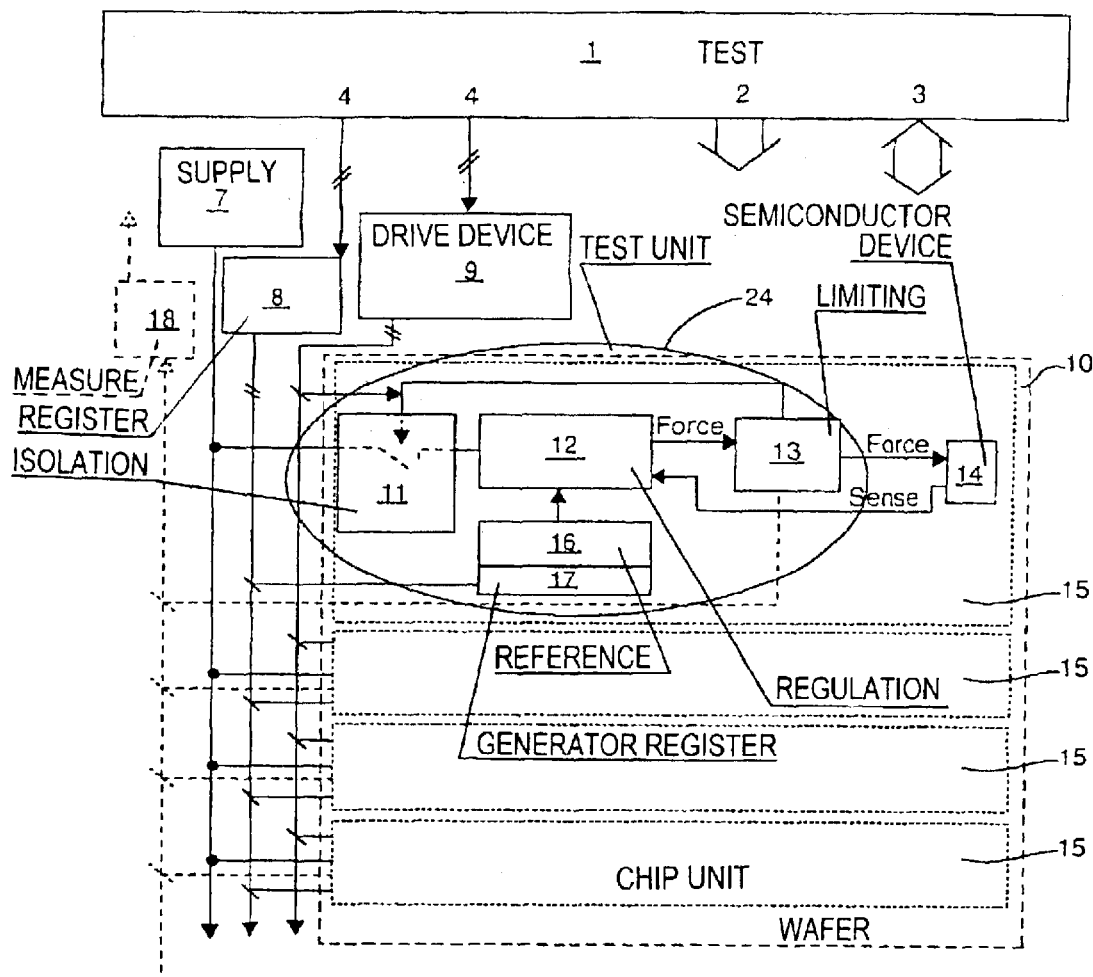
FIG. 2 is a block circuit diagram of an apparatus according to a second exemplary embodiment of the invention.

FIG. 2 shows a test apparatus 1 for testing a plurality of semiconductor devices 14 disposed on a wafer 10. In such a case, the illustration remains limited to the parts that are relevant for the invention.

The test apparatus 1 has a plurality of output channels 2 and bidirectional channels 3. Through the channels 2, 3, the semiconductor devices 14 are stimulated with test signals and their reactions are detected and evaluated.

During the test, a plurality of semiconductor devices 14 is in each case supplied through a common voltage supply unit 7. In this illustration, the common voltage supply unit 7 is shown as an external voltage supply unit. An isolating apparatus 11, a voltage-regulating unit 12, and also a current-limiting unit 13 are in each case disposed successively in the supply path of the semiconductor device 14.

An output voltage of the voltage-regulating unit 12 is controlled through an output of a reference voltage generator 16 assigned to the voltage-regulating unit 12. The output voltage of the reference voltage generator 16, in turn, is programmed by the value of a generator register 17. The value of the generator registers 17 is controlled through a common register 8. The register 8 can be set, for example, through programmable control channels of the test apparatus 1. The isolating apparatus 11 can be controlled by the test apparatus 1 through a drive device 9 in a known way.

A current-limiting unit 13 measures the current consumption of the semiconductor device 14, compares the current consumption with a permissible maximum value and isolates the semiconductor device 14 from the common voltage supply unit 7 with the aid of the isolating apparatus 11 when the permissible maximum value is exceeded.

Furthermore, the measured value of the current consumption is transmitted to the test apparatus 1 through a current measured value interface 18. At least parts of the test unit 24 formed from the isolating apparatus 11, the voltage-regulating unit 12, the current-limiting unit 13, the reference voltage generator 16, and the generator register 17 are situated on the wafer in this example.

Figure 3:
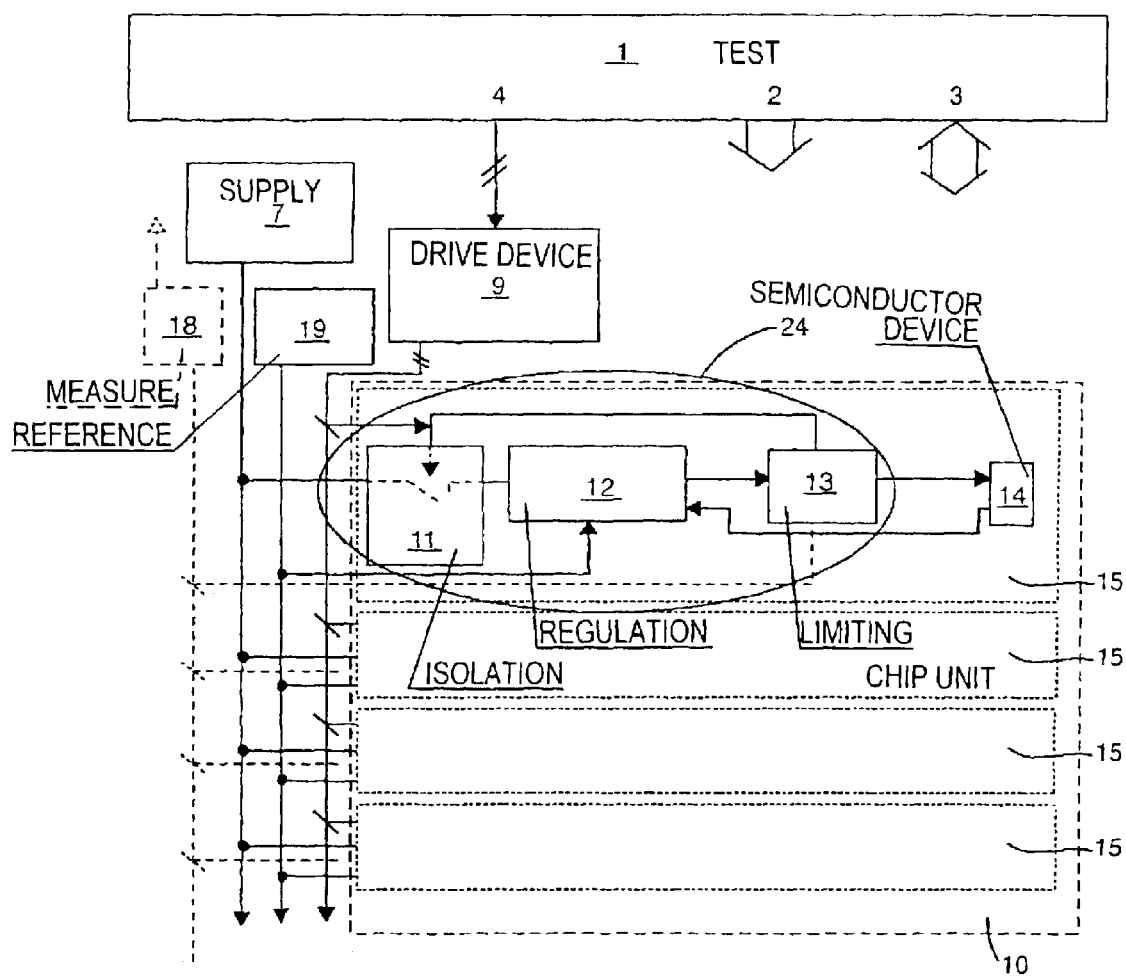
FIG. 3 is a block circuit diagram of an apparatus according to a third exemplary embodiment of the invention.
Figure 4:
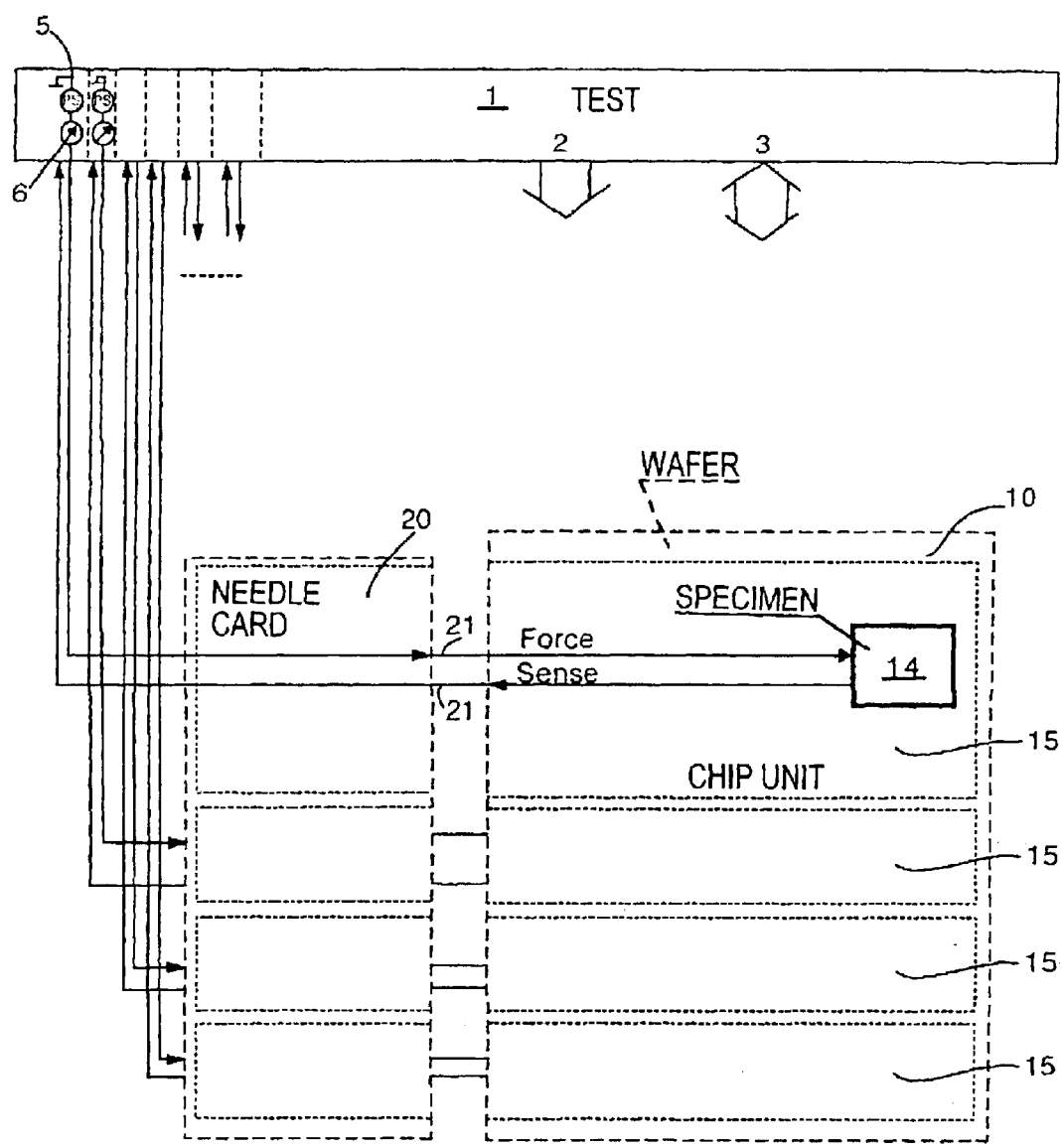
FIG. 4 is a block circuit diagram of a prior art apparatus.
Figure 5:
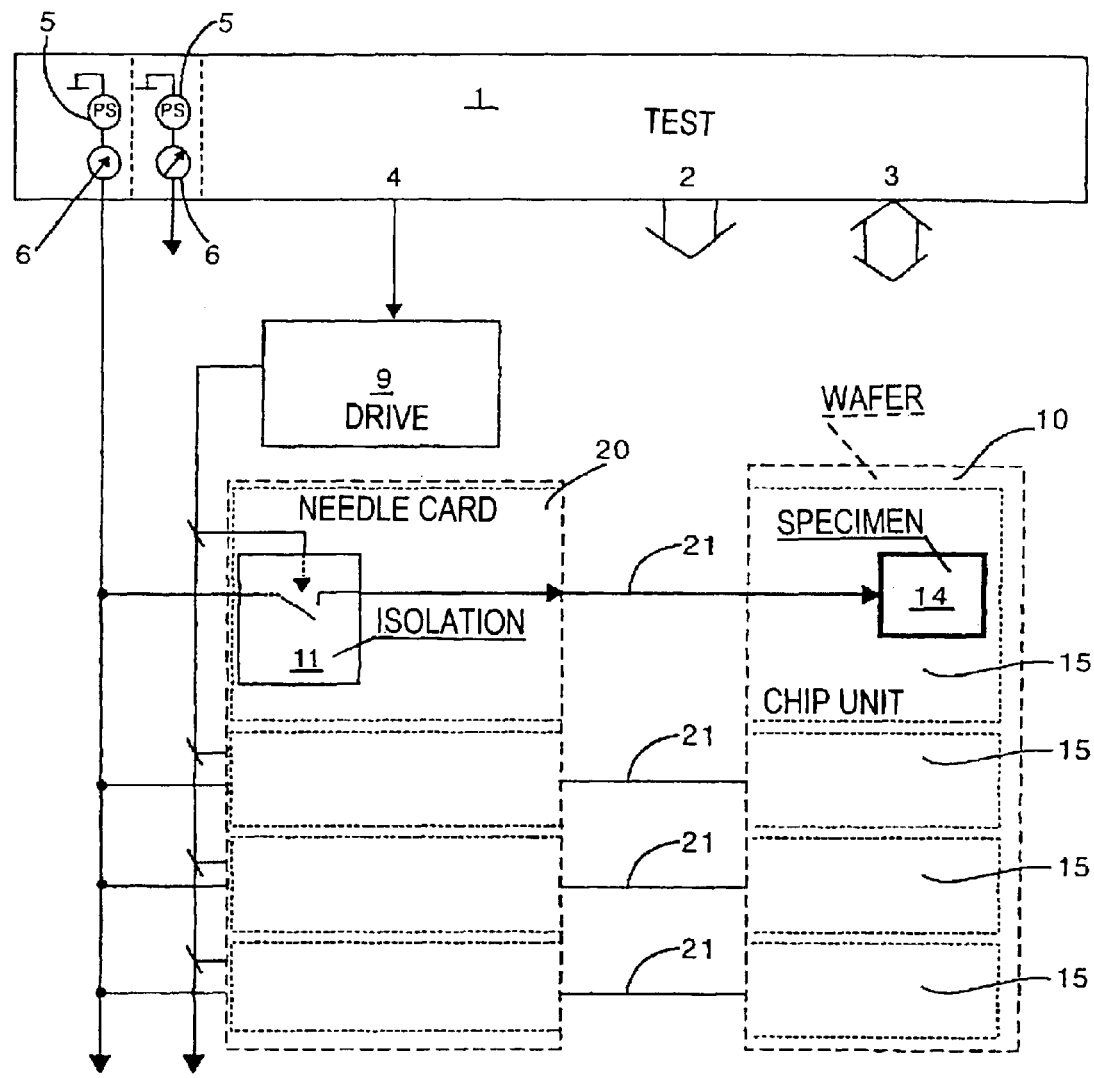
FIG. 5 is a block circuit diagram of a second prior art apparatus.

The apparatus illustrated in FIG. 3 differs from the apparatus described in FIG. 2 in the control of the voltage-regulating units 12. A reference voltage source 19 is used in this case for controlling the voltage-regulating units 12. In this case, one of the precise internal voltage supply units of the test apparatus 1 may also serve as reference voltage source 19.

I claim:

1. An apparatus for the simultaneous and mutually independent testing of voltage-supplied semiconductor devices disposed on a wafer, comprising:

supply paths;

a programmable test apparatus having a plurality of output and input channels to be connected to the semiconductor devices for functionally testing the semiconductor devices;

at least one voltage supply unit connected to said supply paths for supplying voltage through said supply paths to the semiconductor devices during the functional test;

at least one needle card adapted to simultaneously contact connect a plurality of the semiconductor devices, the plurality being a true subset of all of the semiconductor devices disposed on the wafer, said at least one needle card connected to said supply paths;

a plurality of controllable voltage-regulating units and current-limiting units respectively disposed in each of said supply paths between said at least one voltage supply unit and a respective one of the semiconductor devices, each of said current-limiting units at least one of determining and influencing a current intensity in a respective one of said supply paths; and each of said controllable voltage-regulating units regulating a selectable supply potential of a respective one of the semiconductor devices over a section of the functional test.

2. The apparatus according to claim 1, wherein:

said current-limiting units are current measuring units providing output signals; and an isolating apparatus is disposed in each of said supply paths and is connected to a respective one of said current-limiting units, each of said current-limiting units controlling a respective one of said current-limiting units with a respective one of said output signals.

3. The apparatus according to claim 2, including a current measured value interface connecting said current measuring units to said test apparatus, said current measuring units transmitting measured values to said test apparatus.

4. The apparatus according to claim 1, including a common controllable reference voltage source respectively connected to each of said voltage-regulating units, said reference voltage source controlling said voltage-regulating units.

5. The apparatus according to claim 1, including programmable voltage generators respectively connected to each of said voltage-regulating units, said test apparatus programming said programmable voltage generators.

6. The apparatus according to claim 1, wherein said voltage-regulating units and said current-limiting units are to be disposed on the wafer.

7. The apparatus according to claim 6, including isolating apparatuses disposed in said supply paths, said isolating apparatuses to be disposed on the wafer.

8. The apparatus according to claim 7, including:

a common controllable reference voltage source respectively connected to each of said voltage-regulating units, said reference voltage source controlling said voltage-regulating units;

programmable voltage generators respectively connected to each of said voltage-regulating units, said test apparatus programming said programmable voltage generators;

connecting lines between said at least one voltage supply unit, said isolating apparatuses, said reference voltage sources, said voltage-regulating units, said test apparatus, and said reference voltage generators; and said connecting lines being respectively routed at least in sections as bus systems, said bus systems to be disposed on the wafer in a kerf between the semiconductor devices, said connecting lines having connection devices common to a respective one of a plurality of the semiconductor devices.

9. The apparatus according to claim 2, including a wiring interface disposed between said test apparatus and said at least one needle card, said isolating apparatuses disposed on said wiring interface, said needle card having contact needles for contact connecting the wafer and flexible leads connected to said test apparatus through said wiring interface.

10. The apparatus according to claim 8, including a wiring interface disposed between said test apparatus and said at least one needle card, said isolating apparatuses disposed on said wiring interface, said needle card having:

contact needles for contact connecting the wafer; and flexible leads connected to said test apparatus through said wiring interface.

11. The apparatus according to claim 1, including a wiring interface disposed between said test apparatus and said at least one needle card, said current-limiting units and said voltage-regulating units disposed on said wiring interface, said needle card having:

contact needles for contact connecting the wafer; and flexible leads connected to said test apparatus through said wiring interface.

12. The apparatus according to claim 8, including a wiring interface disposed between said test apparatus and said at least one needle card, said current-limiting units and said voltage-regulating units disposed on said wiring interface, said needle card having:

contact needles for contact connecting the wafer; and flexible leads connected to said test apparatus through said wiring interface.

13. The apparatus according to claim 1, wherein each of said voltage-regulating units is to be assigned to exactly one of the semiconductor devices and a supply potential of each of the semiconductor devices is to be individually regulated by a respectively assigned one of said regulating unit during a section of the test.

14. An apparatus for the simultaneous and mutually independent testing of devices, comprising:

a wafer;

voltage-supplied semiconductor devices disposed on said wafer;

supply paths;

a programmable test apparatus having a plurality of output and input channels connected to said semiconductor devices, said test apparatus functionally testing said semiconductor devices;

at least one voltage supply unit connected to said supply paths for supplying voltage through said supply paths to said semiconductor devices during a functional test;

at least one needle card simultaneously contact connecting a plurality of said semiconductor devices, said plurality being a true subset of all of said semiconductor devices disposed on said wafer, said at least one needle card connected to said supply paths;

a plurality of controllable voltage-regulating units and current-limiting units respectively disposed in each of said supply paths between said at least one voltage supply unit and a respective one of said semiconductor devices, each of said current-limiting units at least one of determining and influencing a current intensity in a respective one of said supply paths; and each of said controllable voltage-regulating units regulating a selectable supply potential of a respective one of said semiconductor devices over a section of the functional test.

15. The apparatus according to claim 14, including:

a common controllable reference voltage source respectively connected to each of said voltage-regulating units, said reference voltage source controlling said voltage-regulating units;

programmable voltage generators respectively connected to each of said voltage-regulating units, said test apparatus programming said programmable voltage generators;

connecting lines between said at least one voltage supply unit, said isolating apparatuses, said reference voltage sources, said voltage-regulating units, said test apparatus, and said reference voltage generators; and said wafer having a kerf between said semiconductor devices;

said connecting lines being respectively routed at least in sections as bus systems, said bus systems disposed on said wafer in said kerf, said connecting lines having connection devices common to a respective one of a plurality of said semiconductor devices.

16. The apparatus according to claim 14, wherein each of said voltage-regulating units is assigned to exactly one of said semiconductor devices and a supply potential of each of said semiconductor devices is individually regulated by a respectively assigned one of said regulating unit during a section of the test.

17. A method for the simultaneous and mutually independent testing of a plurality of voltage-supplied semiconductor devices disposed on a wafer, which comprises:

connecting a plurality of output and input channels of a programmable test apparatus to the semiconductor devices for functionally testing the semiconductor devices;

supplying voltage to the semiconductor devices with at least one voltage supply unit during a functional test;

simultaneously contact connecting a plurality of the semiconductor devices to at least one needle card, the plurality being a true subset of all of the semiconductor devices disposed on the wafer;

regulating a supply potential of each of the semiconductor devices independently of the at least one voltage supply unit with controllable voltage-regulating units disposed in a supply path between the at least one voltage supply unit and a respective one of the semiconductor devices; and one of:

limiting a current consumption of an individual semiconductor device through the supply path with a current-limiting unit; and interrupting a supply path of an individual semiconductor device if a maximum permissible current consumption is exceeded.

18. The method according to claim 17, which further comprises:

disposing in a supply path of each of the semiconductor devices a respective isolating apparatus and a current-limiting unit, the current-limiting unit being a current measuring unit detecting current consumption of a respective one of the semiconductor devices in each supply path; and effecting an interruption of a supply path with the respective isolating apparatus if a current consumption is detected to be higher than a maximum permissible current consumption.

19. The method according to claim 18, which further comprises:

connecting the current measuring units to the test apparatus through a common current measured value interface; and transmitting measured values of the current measuring units to the test apparatus through the current measured value interface.

20. The method according to claim 19, which further comprises:

programming at least one drive device with control channels of the test apparatus;

controlling the isolating apparatuses with the at least one drive device;

evaluating the measured values transmitted by the current measuring units in the test apparatus; and effecting an interruption of a supply path with the respective isolating apparatus if a current consumption is detected to be higher than a maximum permissible current consumption.

21. The method according to claim 17, which further comprises:

respectively connecting at least a plurality of the voltage-regulating units to a common reference voltage source; and controlling the plurality of the voltage-regulating units with the reference voltage source dependent upon a given section of the functional test.

22. The method according to claim 17, which further comprises:

connecting each of the voltage-regulating units to a programmable reference voltage generator; and programming the reference voltage generators with the test apparatus dependent upon a given section of the functional test.

* * * * *